(12) United States Patent
Lindell

(10) Patent No.: US 6,963,241 B2
(45) Date of Patent: Nov. 8, 2005

(54) METHOD AND APPARATUS FOR INCREASING THE EFFICIENCY OF A TRANSMITTER

(75) Inventor: Bo Lindell, Lidingö (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 42 days.

(21) Appl. No.: 10/474,445
(22) PCT Filed: Mar. 28, 2002
(86) PCT No.: PCT/EP02/03494
§ 371 (c)(1), (2), (4) Date: Jan. 14, 2004
(87) PCT Pub. No.: WO02/082637
PCT Pub. Date: Oct. 17, 2002

(65) Prior Publication Data
US 2004/0104770 A1 Jun. 3, 2004

Related U.S. Application Data
(60) Provisional application No. 60/284,507, filed on Apr. 19, 2001.

(30) Foreign Application Priority Data
Jun. 4, 2001 (EP) .............................. 01108723

(51) Int. Cl.⁷ .................................................. H03F 3/68
(52) U.S. Cl. ..................... 330/124 R; 330/126; 330/51
(58) Field of Search .................. 330/51, 124 R, 330/126, 149, 53

(56) References Cited

U.S. PATENT DOCUMENTS

| | | | |
|---|---|---|---|
| 4,806,944 A | | 2/1989 | Jacomb-Hood ............ 343/745 |
| 5,008,631 A | * | 4/1991 | Scherer et al. ................ 330/51 |
| 5,361,403 A | | 11/1994 | Dent ........................... 455/74 |
| 5,541,554 A | * | 7/1996 | Stengel et al. ................ 330/51 |
| 5,973,557 A | * | 10/1999 | Miyaji et al. ................. 330/51 |
| 6,023,611 A | | 2/2000 | Bolin et al. ................. 455/114 |
| 6,061,170 A | * | 5/2000 | Rice et al. .................. 359/345 |
| 6,160,449 A | | 12/2000 | Klomsdorf et al. ......... 330/149 |
| 6,252,461 B1 | * | 6/2001 | Raab .......................... 330/302 |
| 6,298,244 B1 | * | 10/2001 | Boesch et al. ........... 455/553.1 |
| 6,853,243 B2 | * | 2/2005 | Sekine et al. ................ 330/51 |

* cited by examiner

Primary Examiner—Michael Tokar
Assistant Examiner—Linh V. Nguyen

(57) ABSTRACT

The present invention relates generally to the field of RF transmitters, and more particularly to a method and apparatus for increasing the efficiency of transmitters which are capable of transmitting at different power levels in each of at least two frequency bands. An inventive method is presented as well as an inventive transmitter comprising at least one power amplifier in which the load in the transmission line is varied as the output power is varied, in order to keep the efficiency of the power amplifier at a high level.

17 Claims, 3 Drawing Sheets

METHOD AND APPARATUS FOR INCREASING THE EFFICIENCY OF A TRANSMITTER

This patent application claims priority from and incorporates by reference the entire disclosure of U.S. Provisional Patent Application No. 60/284,507, filed on Apr. 19, 2001.

FIELD OF THE INVENTION

The present invention relates generally to the field of RF technology, and more particularly to the field of RF transmitters.

BACKGROUND

In many applications of RF transmitters, it is desirable to introduce the possibility of the RF transmitter transmitting at different power levels. This is e.g. the case in mobile radio communications, where the output radio power of the mobile stations as well as of the base stations should advantageously be variable depending on signal quality and distance between transmitter and receiver.

If the change in output power level is effectuated simply by changing the input power level to the power amplifier of the RF transmitter, the power amplifier will, at some power levels, have to work at combinations of power supply voltage and input power level which yields poor efficiency of the power amplifier. The power supply voltage can be adjusted and the efficiency of the power amplifier optimised for the highest of the power levels, while the efficiency will be impaired as the input power level to the power amplifier is lowered. Since in many applications of RF transmitters, such as in mobile stations, one has to rely on a battery as the power supply, the battery having limited energy, poor efficiency of the RF transmitter is a severe problem.

This problem has previously been solved by introducing a settable switched power supply to the power amplifier, so that the power supply voltage can be lowered as the input power level to the power amplifier is lowered, the efficiency of the power amplifier thus staying at a high level. Another solution that has been found is to introduce a transformer with switched steps at the output of the power amplifier, so that, without changing the input power level tot he power amplifier, the output signal power can be varied as different parts of the transformer is connected to the transmitter output at different times. However, there are certain drawbacks with each of these solutions. A settable switched power supply generates disturbances which interferes with the RF signal to be transmitted. Further, it is difficult to design transformers for ultra high frequencies covering large frequency ranges. As many RF transmitters today are designed for large frequency ranges, as in e.g. mobile radio telephony, where transmitters often are designed to operate in more than one frequency band, the frequency bands being far apart, the transformer solution is not optimal. Thus, it is desirable to find a transmitter which can transmit RF signals at different power levels in a wide frequency range without impairing the efficiency as the output power is changed, that does not introduce disturbances to the RF signal as the output power is changed.

SUMMARY

An object of the present invention is to provide a method and apparatus by which the transmission power level of an RF transmitter, capable of transmitting in more than one frequency band, can be varied without significantly impairing the efficiency of the transmitter and without introducing disturbances to the transmitted RF signal.

This object is met by transmitter for transmitting RF signals at at least two power levels in each of at least two frequency bands. The transmitter comprises at least one power amplifier connected to a working load and to a first electronic circuit. The first electronic circuit is connected, in parallel to the working load, to the at least one power amplifier at a line length from the at least one power amplifier. The first electronic circuit comprises a reactive impedance and a switching device connected in series, the reactive impedance and the line length having been chosen as to provide, when the switching device is closed, a load selected with regard to the efficiency of the at least one power amplifier when the transmitter transmits at one of the at least two power levels. If the transmitter comprises more than one power amplifier, the line lengths at which the first electronic circuit is connected to the power amplifiers is different for each power amplifier.

The object of the invention is further met by an inventive method for improving the efficiency of a transmitter upon changing the output power level at which the transmitter transmits. The transmitter is capable of transmitting at at least two power levels in each of at least two frequency bands, and the transmitter comprises a power amplifier connected to a working load. In the inventive method, at least one electronic circuit is connected, in parallel with the working load, to the power amplifier at a line length from the power amplifier, the electronic circuit comprising a switching device and a reactive impedance, the line length and the reactive impedance being chosen to form an optimal load with regard to the efficiency of the power amplifier when the transmitter transmits in one of the at least two frequency bands at one of the at least two power levels. If the transmitter transmits at the power level and in the frequency band for which the line length and the reactive impedance has are chosen to form an optimal load, then said switching device is closed. If the RF transmitter transmits at a power level and/or in a frequency band for which the line length and the reactive impedance are not chosen to form an optimal load, then said switching device is opened.

By the method and the transmitter of the invention is achieved that the load of a power amplifier of a transmitter can, in a simple manner, without introducing disturbances to the transmitted RF signal, be adjusted to the power level at which the transmitter transmits. Thus, the efficiency of the power amplifier and hence of the transmitter will not have to be impaired by a change in the output power of the transmitter.

In one embodiment of the inventive transmitter, the at least one power amplifier is two separate power amplifiers, each operable on RF signals in one of the at least two frequency bands. The two power amplifiers are in this embodiment connected to the first electronic circuit at different line lengths. The reactive impedance of the first electronic circuit and the two line lengths are selected in a manner as to provide said load, when the switching device is closed, when the transmitter transmits in one of the at least two frequency bands. In one aspect of this embodiment, the reactive impedance is selected in a manner as to provide said load, when the switching device is closed, no matter in which of the at least two frequency bands transmitter transmits. The at least two power levels at which the transmitter is designed for transmitting could then be the same for the at least two frequency bands, or different. The reactive impedance of the first electronic circuit could in this embodiment e.g. be formed by a capacitor and an inductor connected in parallel or in series. Furthermore, the two power amplifiers could be capable of operating on RF signals of different modulation modes.

In a second embodiment of the inventive transmitter, the at least one power amplifier is one single power amplifier operable on RF signals of the at least two frequency bands, to which a second electronic circuit is connected. The second electronic circuit is connected in parallel to the working load and the first electronic circuit, at a second line length from the power amplifier. The second electronic circuit comprises a second reactive impedance and a second switching device. The reactive impedance and the line length of the first electronic circuit are adjusted to provide said load selected with regard to the efficiency of the power amplifier when the dual mode RF transmitter transmits at one of the at least two power levels in the first of the at least two frequency bands. The second reactive impedance and the second line length have been chosen to provide a load selected with regard to the efficiency of the power amplifier when the dual mode RF transmitter transmits at one of the at least two power levels in a second of the at least two frequency bands. The power level with regard to which the reactive impedance and the line length of the first electronic circuit has been chosen and the power level with regard to which the reactive impedance and the line length of the second electronic circuit has been chosen could be the same, or different.

In a third embodiment of the inventive transmitter, wherein the at least one power amplifier is one single power amplifier operable on RF signals of the at least two frequency bands, the transmitter comprises a filter arrangement connected at the output of the power amplifier. The filter arrangement provides different electrical lengths for the at least two frequency bands. These electrical lengths, the line length and the reactive impedance of the first electronic circuit has been chosen in a manner as to provide said load, when the switching device is closed, when the transmitter transmits in at least one of the at least two frequency bands. The electrical lengths, the line length and the reactive impedance of the first electronic circuit could have been chosen in a manner as to provide said load, when the switching device is closed, no matter in which of the at least two frequency bands the transmitter transmits.

In one aspect of the invention, the line length(s) and the reactive impedance of the first electronic circuit have been chosen so that ratio of the load when the switching device is open and the load when the switching device is closed equals the ratio of the power level for which the transmitter is designed to transmit when the switching device is closed and the power level for which the transmitter is designed to transmit when the switching device is open.

In one aspect of the inventive method, the at least one electronic circuit is one single electronic circuit and the dual mode RF transmitter comprises two separate power amplifiers connected at different line lengths to the electronic circuit. Each power amplifier is operable on RF signals in one of the frequency bands. The reactive impedance of the electronic circuit and the two line lengths are selected in a manner as to provide said load, when the switching device is closed, no matter in which of the at least two frequency bands the transmitter transmits.

BRIEF DESCRIPTION OF THE DRAWINGS

The present invention will now be discussed in more detail with reference to preferred embodiments of the present invention, given only by way of example, and illustrated in the accompanying drawings, in which.

DETAILED DESCRIPTION

In order to increase the efficiency of a power amplifier as the output power of the RF signal transmitted by an RF transmitter is varied, one could use a variable load in the transmission path, additional to the working load. When the power level of the RF signal which is fed into the power amplifier is changed in order to change the power level of the transmitted RF signal, the load of the transmission path could be changed into a load for which the efficiency of the power amplifier is kept at a high value. The output voltage of the power amplifier is advantageously kept constant as the transmitter output power level is varied, while the load experienced by the power amplifier is varied. The energy consumed by the power amplifier would then be less than if the RF signal which is fed into the power amplifier would be changed without adjusting the load.

Figure 1:
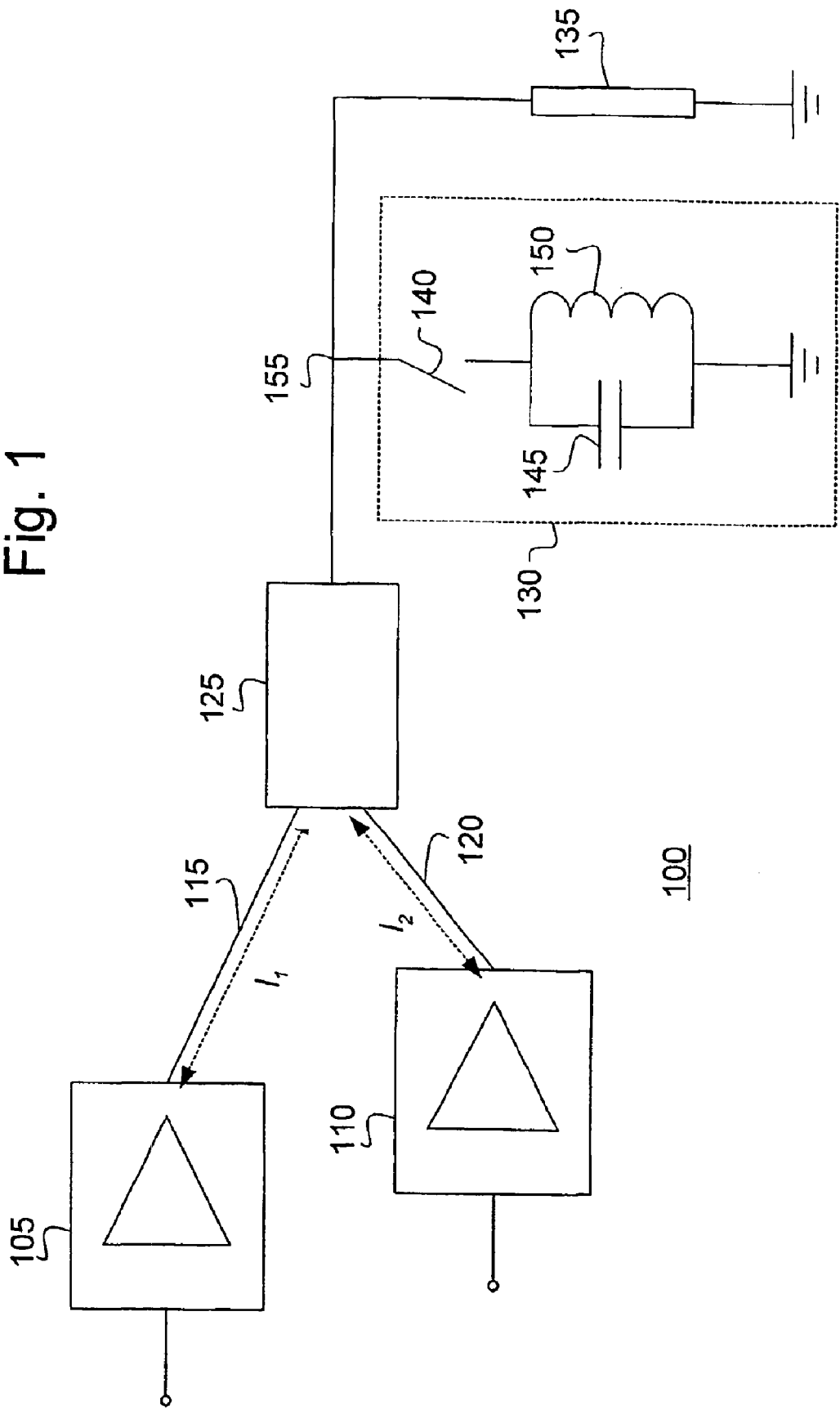
FIG. 1 is a dual band RF transmitter for transmitting at two different power levels, the dual band RF transmitter comprising two power amplifiers.

An example of a dual band RF transmitter 100, or simply transmitter 100, operating according to the principle of varying the load in accordance with at which power level the transmitter 100 is transmitting is schematically shown in FIG. 1, the transmitter 100 for transmitting RF signals in two different frequency bands $f_1$ and $f_2$. These frequency bands could e.g. be 890 Mz to 915 MHz and 1710 MHz and 1785 MHz, corresponding to the uplink frequency bands of GSM (Global System for Mobile Communication) and DCS (Digital Communication System), or any other frequency bands. The dual band RF transmitter 100 of FIG. 1 comprises two power amplifiers 105 and 110. Power amplifier 105 operates on RF signals in one of the two frequency bands, $f_1$, while power amplifier 110 operates on RF signals in the other frequency band, $f_2$. Two transmission paths 115 and 120 connect power amplifier 105 and 110, respectively, to a combiner 125 which connects the two power amplifiers 105 and 110 to the same output port. The line lengths $l_1$ and $l_2$ of the transmission paths 115 and 120 could be adjusted separately. The combiner 125 could e.g. be a filter diplexer or a switch. The output of combiner 125 is then connected to an electronic circuit 130 and a working load 135, the electronic circuit 130 and the working load 135 being connected in parallel. The working load 135 could e.g. be another amplifier or an antenna, where the antenna could e.g. comprise an antenna array.

The electronic circuit 130 comprises a switch 140 connected in series to a reactive impedance, the reactance of the reactive impedance being frequency dependent and the reactive impedance thus providing different reactances in the two frequency bands. In FIG. 1, a capacitor 145 of capacitance $C_{145}$ and an inductor 150 of inductance $L_{150}$ connected in parallel is used as an exemplary reactive impedance. The reactive impedance of electronic circuit 130 could alternatively comprise a capacitance and an inductance connected in series, or a more complex network. When the switch 140 is open, the impedance that an RF signal experiences at the output of power amplifier 105 or 110 is set by the impedance of the working load 135, while when the switch 140 is closed, the impedance experienced by an RF signal will be determined by the impedance of the working load 135 and the impedance of electronic circuit 130.

The reflection coefficient ρ of a transmission path with characteristic admittance $Y_0$ and a connected load of admittance $Y_L$ is defined as:

$$\rho = \frac{Y_0 - Y_L}{Y_0 + Y_L} = \frac{1 - \frac{Y_L}{Y_0}}{1 + \frac{Y_L}{Y_0}} = \frac{1 - y_L}{1 + y_L}, \quad (1)$$

where $y_L$ is the normalised load admittance. The impedance Z experienced at an electrical length φ from the point where the load is connected is then $$Z = Z_0 \frac{1 + \rho e^{-2j\varphi}}{1 - \rho e^{-2j\varphi}} \quad (2)$$

where $Z_0 = 1/Y_0$ and the electrical length φ is measured in wavelengths of the RF signal on the transmission path expressed in angular terms.

In FIG. 1, the electronic circuit 130 and the working load 135 are both connected at the connection point 155. If the working load 135 is assumed to be only resistive, the admittance of the total load when the switch 140 is closed, $Y_L^{closed}$, can be written as $$Y_L^{closed} = G_{WL} + jB_{130} = G_{WL} + j\left(\omega C_{145} - \frac{1}{\omega L_{150}}\right) \quad (3)$$

where $G_{WL}$ is the conductance of the working load, $B_{130}$ is the susceptance of electronic circuit 130 and ω is the angular frequency of the RF signal. When the switch 140 is open, the admittance of the total load $Y_L^{open}$ is simply $$Y_L^{open} = G_{WL} \quad (4)$$

If the impedance of the working load 135 has a reactive component, expressions (3) and (4) will have to be adjusted accordingly.

When designing the transmitter 100 for different load impedances at different output power levels, the different load impedances are advantageously chosen so that the output voltage of power amplifiers 105 and 110 stays the same as the transmitter output power level is varied. The ratio of $Z_{closed}$ and $Z_{open}$ could hence advantageously equal the ratio of the power levels $P_{open}$ and $P_{closed}$ for which the switching device 140 is designed to be open and closed, respectively. By inserting equation (3) and (4) into equation (1), equations for the reflection coefficients $\rho_{closed}$ and $\rho_{open}$ can be found, respectively. By inserting $\rho_{closed}$ into equation (2), a value for $Z_{closed}$ at an electrical length φ from the connection point 155 can be obtained, while inserting $\rho_{open}$ into the same equation similarly yields an expression for $Z_{open}$. If the admittance of the working load, $G_{WL}$, equals the characteristic admittance, $Y_0$, then $\rho_{open} = 0$ and the load experienced by the power amplifiers 105 and 110 when switch 140 is open is $Z_0$, independent of the line lengths $l_1$ and $l_2$. The expression for the ratio $Z_{closed}/Z_{open}$, set equal to the desired value of $P_{open}/P_{closed}$, is then:

$$\frac{Z_{closed}}{Z_0} = \frac{1 - \frac{jB_{130}}{2Y_0 + jB_{130}} e^{-2j\varphi}}{1 + \frac{jB_{130}}{2Y_0 + jB_{130}} e^{-2j\varphi}} = \frac{P_{open}}{P_{closed}} \quad (5)$$

Expression (5) is solved by two different sets of values of the susceptance $B_{130}$ and electrical length φ. The power amplifiers 105 and 110 each has an independent electrical length $\varphi_{105}$ and $\varphi_{110}$ to the connection point 155, the electrical lengths being independently adjustable as the length of the transmission paths 115 and 120 are varied. Furthermore, the susceptance $B_{130}(\omega)$ is a function of frequency. Since the power amplifiers operate on RF signals in different frequency bands, each power amplifier operating on RF power signals in only one of the frequency bands, the values of $\varphi_{105}$ and $B_{130}(\omega_1)$ as well as $\varphi_{110}$ and $B_{130}(\omega_2)$ can be chosen so that the value of $Z_{closed}/Z_{open}$ stays the same, no matter in which of the two frequency bands the transmitter 100 is transmitting. By choosing $C_{145}$ and $L_{150}$ so that the resonance frequency of electronic circuit 130 lies between the two frequency bands $f_1$ and $f_2$, the susceptance $B_{130}$ could e.g. take one value at the frequency band $f_1$, and another value, the modulus being the same but the sign being the opposite, at frequency band $f_2$.

For illustrative purposes, a numerical example will be given below, based on an exemplary dual band RF transmitter 100 operating in two exemplary frequency bands centred around the frequencies 900 MHz and 1800 MHz, respectively. The desired power level of the example, when the switch 140 is closed, is half that of when the switch is open, i.e. the desired value of ratio $P_{open}/P_{closed}$ is 2. The characteristic admittance $Y_0$ in the example is 0.02 $\Omega^{-1}$. The RF signal travels on the exemplary transmission line with a speed of 0.6 c, where c is the speed of light. By inserting the values applicable to the example in expression (5), one gets the following expression, where $b = B_{130}/Y_0$:

$$2 = \frac{1 - \frac{jbe^{-2j\varphi}}{2 + jb}}{1 + \frac{jbe^{-2j\varphi}}{2 + jb}} \quad (6)$$

Expression (6) is satisfied by the following sets of b and φ:

$$b_1 = -\sqrt{\frac{1}{2}} \qquad b_2 = +\sqrt{\frac{1}{2}} \quad (7)$$

$$\sin 2\varphi_1 = +\frac{2\sqrt{2}}{3} \qquad \sin 2\varphi_2 = -\frac{2\sqrt{2}}{3}$$

$$\cos 2\varphi_1 = -\frac{1}{3} \qquad \cos 2\varphi_2 = -\frac{1}{3}$$

$$\varphi_1 = 54.5° + n180° \qquad \varphi_2 = 125.5° + n180°$$

In the calculations of the numerical example, one frequency in each of the two frequency bands is selected and inserted in the above expressions: the frequency 900 MHz is used to represent the first frequency band, and 1800 MHz is used to represent the second frequency band. By inserting the two values of the angular frequencies $\omega_1$ and $\omega_2$, corresponding to the two frequencies 900 MHz and 1800 MHz, into the expression for b, $$b = B_{130}/Y_0 = \frac{1}{Y_0}(\omega C_{145} - 1/\omega L_{150}),$$

and setting the expression equal to the roots $b_1$ and $b_2$, one can obtain suitable values for $C_{145}$ and $L_{150}$. In the example presently discussed, it is found that $C_{145}$ should be chosen to 2.5 pF and $L_{150}$ should be chosen to 6.3 nH.

By, in a similar manner, using the roots $\phi_1$ and $\phi_2$ of expression (7) and the values of the frequencies $f_1$ and $f_2$, one can obtain values of the line lengths $l_1$ and $l_2$ that should be parting the power amplifiers 105 and 100, respectively, and the connection point 155. Since the RF signal of the example is transmitted by 0.6 c, where c is the speed of light, the expression for l can be written as $$l = \frac{0.6c}{f} \frac{\varphi}{360°}.$$

It is then found that $l_1$, corresponding to the lower frequency band, should be 3.0 cm, while $l_2$, corresponding to the frequency band, should be 3.5 cm. Any number of half wavelengths of the respective RF signal could be added to these lengths.

The numerical example given above is merely an illustrative example used for illustration purposes, and the inventive transmitter of FIG. 1 could be used in any two frequency bands, with any ratio between the two output power levels and with any impedance on the working load. The characteristic admittance $Y_0$ of the transmission lines could take any value. Furthermore, the inventive transmitter shown in FIG. 1 could be a dual mode transmitter, i.e. the power amplifiers 105 and 110 could not only be operable on RF signals of different frequencies, but also of different modulation modes. Power amplifier 105 could e.g. be operable on an AM modulated signal of frequency $f_1$, while power amplifier 110 was operable on an FM modulated signal of frequency $f_2$. The capacitor 145 and inductor 150 of electronic circuit 130 could be connected in series instead of in parallel as shown in FIG. 1, or a more complex network could be used as the reactive impedance of electronic circuit 130. Expression (3) would then have to be adjusted accordingly.

The RF signals transmitted by transmitter 100 in frequency band $f_1$ could either be transmitted at the same power as the RF signals in frequency band $f_2$, or at a different power. If the reactive impedance of electronic circuit 130 and the line lengths $l_1$ and $l_2$ are chosen so that the admittance $Y_L^{closed}$ in frequency band $f_1$ is the same as the admittance $Y_L^{closed}$ in frequency band $f_2$, then the ratio between the two power levels for which the loads are adjusted would be the same. One could also choose to select the reactive impedance of electronic circuit 130 and the line lengths $l_1$ and $l_2$ in a manner so that the admittance $Y_L^{closed}$ is different for the two frequency bands.

Figure 2:
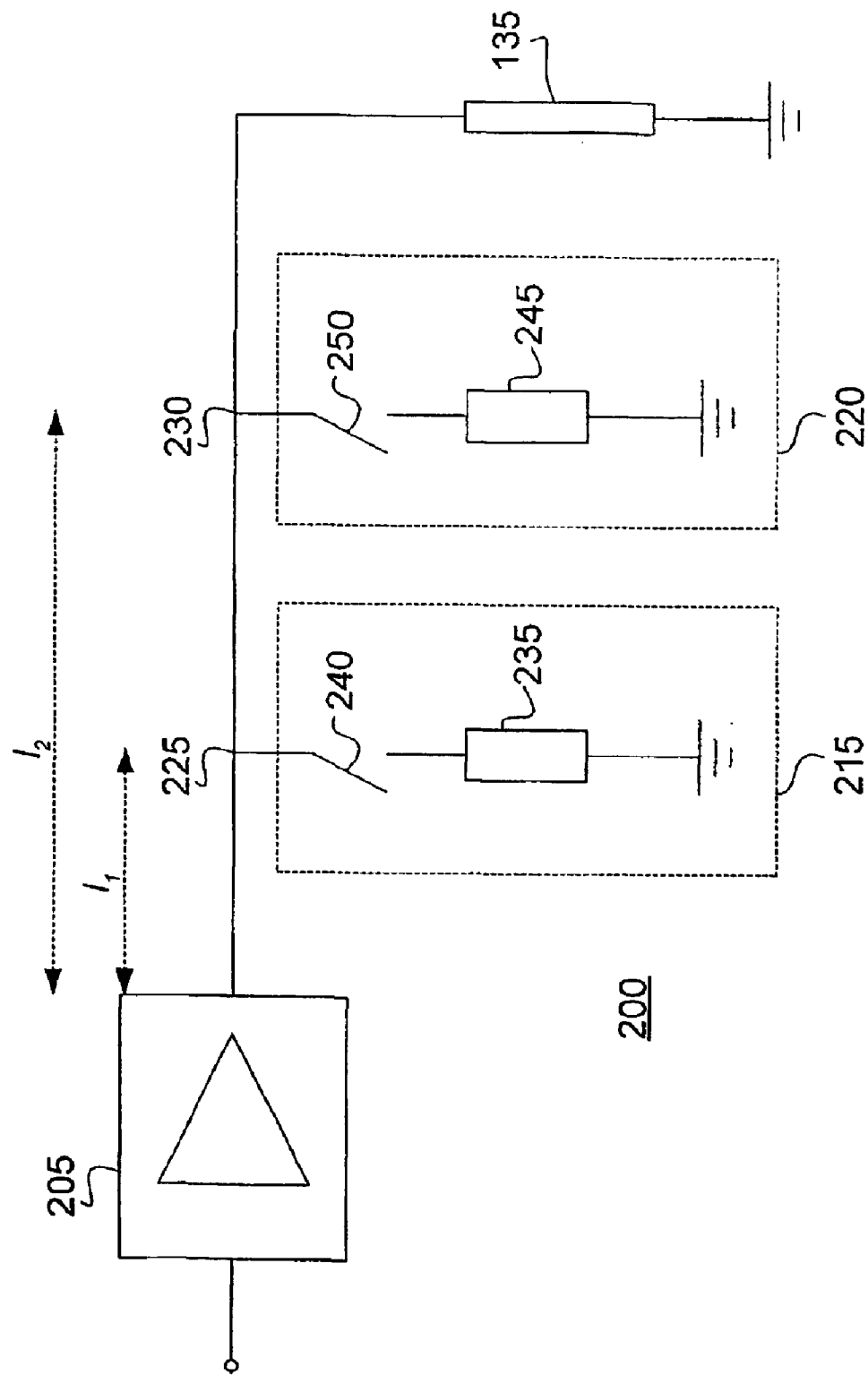
FIG. 2 is a dual band RF transmitter for transmitting at two different power levels, the dual band transmitter comprising one single power amplifier.

In FIG. 2, a dual band RF transmitter 200, or simply transmitter 200, is schematically shown, the transmitter 200 capable of transmitting RF signals in two different frequency bands $f_1$ and $f_2$. Transmitter 200 comprises a power amplifier 205, operable on RF signals in both frequency bands $f_1$ and $f_2$, connected to a working load 135. Connected in parallel to the working load 135 are two electronic circuits 215 and 220, connected at the connection points 225 and 230 at a line length $l_1$ and $l_2$ from the power amplifier, respectively. Electronic circuit 215 comprises reactive impedance 235 of impedance $X_{235}(\omega)$ and a switch 240, while electronic circuit 220 comprises reactive impedance 245 of impedance $X_{245}(\omega)$) and switch 250. The electrical lengths between the output of the power amplifier and the connection points 225 and 230, $\phi_{225}$ and $\phi_{230}$, could be adjusted independently since the line lengths $l_1$ and $l_2$ could be chosen independently. The values of $X_{235}(\omega)$, $X_{245}(\omega)$, $\phi_{225}$ and $\phi_{230}$ could be chosen according to the principles of expressions (1) and (2) so that having switch 240 closed when transmitting in frequency band $f_1$ would give the same impedance experienced by the power amplifier 205 as having switch 250 closed when transmitting in frequency band $f_2$. Each electronic circuit 215 and 220 can hence be adjusted for operating in one of the frequency bands, and the electronic circuits 215 and 220 can be adjusted to provide the same, or similar, load when the switch 240 (in case of $f_1$) or switch 250 (in case of $f_2$) is closed. Thus, by having both switches open, one load adjusted for transmission at a first power level is obtained, and by having that switch closed which has been adjusted for the frequency band at which the transmitter presently is transmitting, another load, adjusted for transmission at a second power level, is obtained. Alternatively, one could design the transmitter 200 for transmission at different power levels in the two frequency bands $f_1$ and $f_2$, so that the reactive impedance 235 of electronic circuit 215 provides an impedance in the frequency band $f_1$ which is different to the impedance provided by reactive impedance 245 in the frequency band $f_2$.

Figure 3:
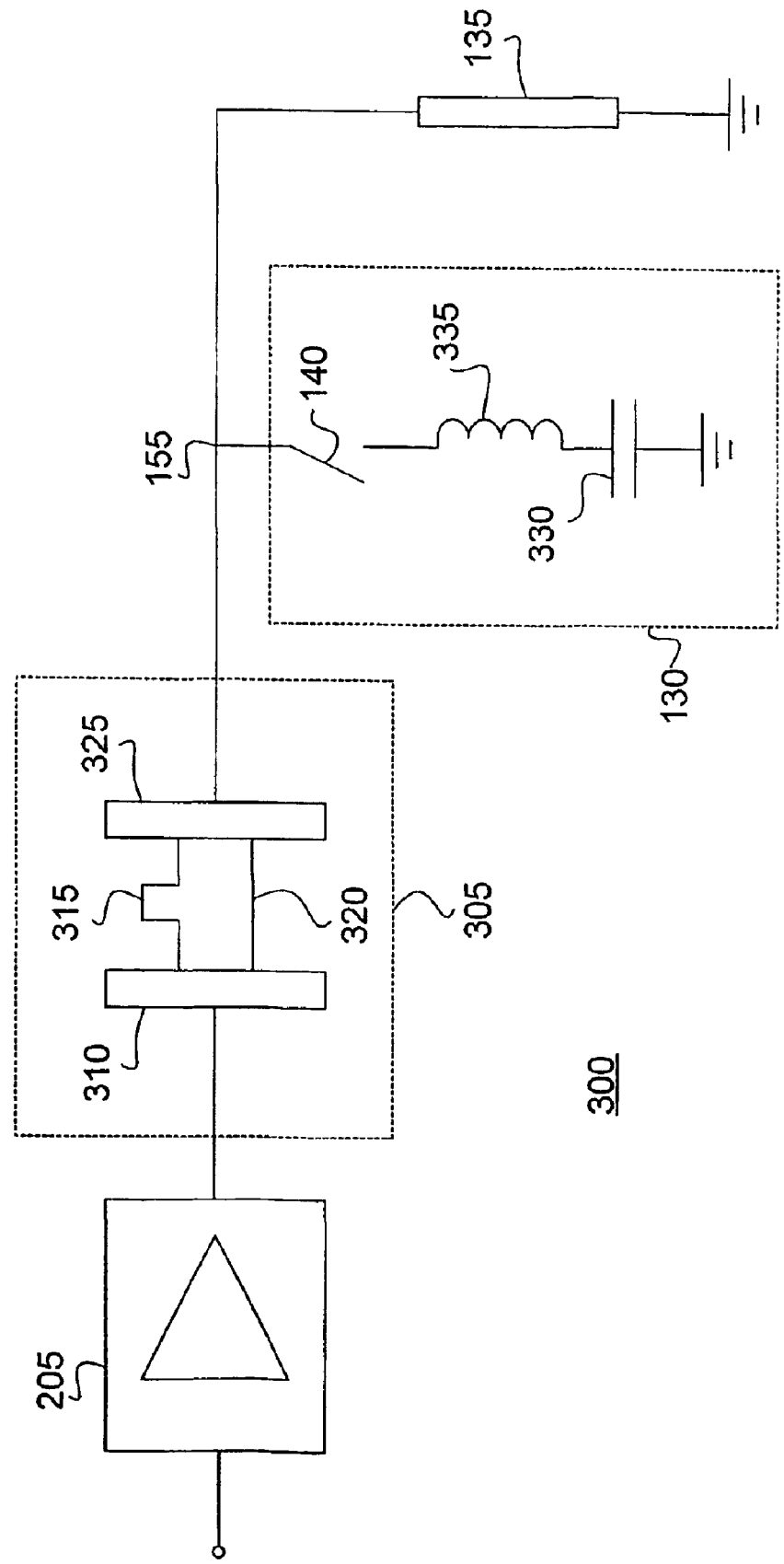
FIG. 3 is another dual band RF transmitter for transmitting at two different power levels comprising one single power amplifier.

In FIG. 3, a dual band RF amplifier 300 comprising only one power amplifier 205 operable on RF signals in both frequency bands $f_1$ and $f_2$ is shown. The RF dual band transmitter 300 comprises a filter arrangement 305, providing different line lengths for signals of the two frequency bands $f_1$ and $f_2$. The filter arrangement 305 is connected in series between the output of the power amplifier 205 and the working load 135. At the output of the filter arrangement 305, an electronic circuit 130, similar to the electronic circuit 130 in FIG. 1, is connected in parallel to the working load 135. The exemplary filter arrangement 305 shown in FIG. 3 comprises a diplexer 310, which divides the incoming RF signal so that the part of the RF signal which lies in the frequency band $f_1$ is transmitted on the transmission path 315, and the part of the RF signal which lies in the frequency band $f_2$ is transmitted on the transmission path 320. The line lengths of the transmission paths 315 and 320 could be adjusted independently to satisfy the desired electrical lengths for the relevant frequency band, $f_1$ or $f_2$. The transmission paths 315 and 320 are then connected to a combiner 325, which connects the two transmission paths 315 and 320 to the same output port. The filter arrangement 305 could e.g. be replaced by a single filter capable of providing different line lengths for the signals of the two different frequency bands. By introducing filter arrangement 305 which provides different electrical lengths for RF signals in the two frequency bands, it is achieved that despite having one single power amplifier 205 operable on both frequency bands, one single electronic circuit 130, comprising one switching device connected in series to a reactive impedance, can be used. In the exemplary electronic circuit 130 shown in FIG. 3, the reactive impedance is shown as a capacitor 330 connected in series to an inductor 335, but the reactive impedance of electronic circuit 130 could consist of an inductance and a capacitance being connected in parallel, or of a more complex network.

The capacitor 145 and inductor 150 of FIG. 1 could be replaced by suitable lengths of line, or by any other arrangement which has a suitable impedance with the desired frequency dependence. The same would be valid for capacitor 330 and inductor 335 of FIG. 3. Reactive impedances $X_{235}(\omega)$ and $X_{245}(\omega)$ of FIG. 2 could consist of capacitors and inductors connected in a suitable manner, or suitable lengths of line, or of any other arrangement which gives a reactive impedance of the desired value. The switches 140, 240 and 250 could be diode switches, relays, or any other type of switching arrangement. The impedance of electronic circuit 130, together with value of the electrical lengths $\phi_{105}$ and $\phi_{110}$, can be chosen so that a closed switch 140 gives either a higher or a lower output power level than an open switch 140. Analogously, the values of $X_{235}(\omega)$, $X_{245}(\omega)$ and $\phi_{225}$, $\phi_{230}$ can be chosen so that a closed switch gives either a higher or a lower output power level than an open switch. In FIGS. 1 and 2, the switches 140, 240 and 250 have been shown to be connected between the power amplifier and the reactive impedances of the electronic circuits. The switches 140, 240 and 250 could very well be positioned on the other side of the reactive impedances, between the reactive impedance of the relevant electronic circuit and the ground.

The above discussed invention could be useful in many different applications of RF transmitters, among which dual band RF transmitters in dual band mobile stations is an important application. The exemplary transmitters 100, 200 and 300 shown in FIG. 3 above are all dual band RF transmitters capable of transmitting RF signals in two separate frequency bands. It should however be understood that the invention is not limited to dual band RF transmitters, but could be applied to transmitters capable of transmitting RF signals in more than two frequency bands.

The invention could be used for transmission at other power levels than the power levels for which the load has been adjusted. If e.g. the transmitter 100 of FIG. 1 would be used for transmission at a power level that is not one of the power levels for which the load has been adjusted, the switch 140 could either be open or closed. Whether the switch should be open or closed could be made dependant on which of the two loads that would yield the best efficiency of the two power amplifiers 105 and 110 at a particular power level. Similarly, the switches 240 and 250 of FIG. 2 as well as switch 140 of FIG. 3 could be either open or closed when transmitting at a power level which is not one of the power levels for which the load has been adjusted.

One skilled in the art will appreciate that the present invention is not limited to the embodiments disclosed in the accompanying drawings and the foregoing detailed description, which are presented for purposes of illustration only, but it can be implemented in a number of different ways, and it is defined by the following claims.

What is claimed is:

1. A transmitter for transmitting RF signals at at least two power levels in each of at least two frequency bands, the transmitter comprising:
at least one power amplifier connected to a working load;
a first electronic circuit connected, in parallel to the working load, to the at least one power amplifier at a line length from the at least one power amplifier;
wherein the first electronic circuit comprises a reactive impedance and a switching device connected in series, the reactive impedance and the line length having been chosen so as to provide, when the switching device is closed, a load selected with regard to the efficiency of the at least one power amplifier when the transmitter transmits at one of the at least two power levels; and
wherein, if the at least one power amplifier is more than one power amplifier, the line length at which the first electronic circuit is connected to the power amplifiers is different for each power amplifier.

2. The transmitter of claim 1, wherein:
the at least one power amplifier is two separate power amplifiers, each of the two separate power amplifiers being operable on RF signals in one of the at least two frequency bands, the two separate power amplifiers being connected to the first electronic circuit at different line lengths; and
the reactive impedance of the first electronic circuit and the two line lengths are selected in a manner so as to provide said load, when the switching device is closed, when the transmitter transmits in at least one of the at least two frequency bands.

3. The transmitter of claim 2, wherein the reactive impedance of the first electronic circuit and the two line lengths are selected in a manner so as to provide said load, when the switching device is closed, no matter in which of the at least two frequency bands the transmitter transmits.

4. The transmitter of claim 3, wherein the at least two power levels are the same for the at least two frequency bands.

5. The transmitter of claim 2, wherein the two power amplifiers are capable of operating on RF signals of different modulation modes.

6. The transmitter of claim 1, wherein:
the at least one power amplifier is one single power amplifier operable on RF signals of all of the at least two frequency bands;
a second electronic circuit is connected, in parallel to the working load and the first electronic circuit, to the power amplifier at a second line length from the power amplifier, the second electronic circuit comprising a second reactive impedance and a second switching device;
the reactive impedance and the line length of the first electronic circuit are adjusted to provide said load when the transmitter transmits in the first of the at least two frequency bands; and
the second reactive impedance and the second line length have been chosen to provide a load selected with regard to the efficiency of the power amplifier when the transmitter transmits at one of the at least two power levels in a second of the at least two frequency bands.

7. The transmitter of claim 6, wherein the power level with regard to which the reactive impedance and the line length of the first electronic circuit has been chosen and the power level with regard to which the reactive impedance and the line length of the second electronic circuit has been chosen are the same.

8. The transmitter of claim 1, wherein:
the at least one power amplifier is one single power amplifier operable on RF signals of all of the at least two frequency bands;
a filter arrangement is connected at an output of the power amplifier, the filter arrangement providing different electrical lengths for the at least two frequency bands; and
said electrical lengths, the line length, and the reactive impedance of the first electronic circuit being chosen so as to provide said load, when the switching device is closed, when the transmitter transmits in at least one of the at least two frequency bands.

9. The transmitter of claim 8, wherein the electrical lengths, the line length, and the reactive impedance of the first electrical circuit being chosen so as to provide said load, when the switching device is closed, no matter in which of the at least two frequency bands the transmitter transmits.

10. The transmitter of any of the above claims, wherein:
the reactive impedance of the first electronic circuit is formed by a capacitor and an inductors; and
the capacitor and the inductor are connected in parallel or in series.

11. The transmitter of claim 1, wherein the line length(s) and the reactive impedance of the first electronic circuit are chosen so that a ratio of the load when the switching device is open and the load when the switching device is closed equals a ratio of the power level for which the transmitter is designed to transmit when the switching device is closed and the power level for which the transmitter is designed to transmit when the switching device is open.

12. The transmitter of claim 1, wherein the working load is an antenna.

13. The transmitter according to claim 1, wherein the transmitter is incorporated in a mobile station.

14. A method for improving the efficiency of a transmitter upon changing the output power level at which the transmitter transmits, the transmitter being capable of transmitting at at least two power levels in each of at least two frequency bands, the transmitter comprising at least one power amplifier connected to a working load, the method comprising:

connecting an electronic circuit, in parallel to the working load, to the at least one power amplifier at a line length from the power amplifier;

wherein the electronic circuit comprises a switching device and a reactive impedance, the line length and the reactive impedance being chosen to form an optimal load with regard to the efficiency of the at least one power amplifier when the transmitter transmits in one of the frequency bands at one of the at least two power levels;

if the transmitter transmits at the power level and in the frequency band for which the line length and the reactive impedance are chosen to form an optimal load, closing said switching device; and if the transmitter transmits at at least one of a power level and in a frequency band for which the line length and the reactive impedance are not chosen to form said optimal load, opening said switching device.

15. The method of claim 14, wherein:
the transmitter comprises two separate power amplifiers, the two separate power amplifiers being connected at different line lengths to the electronic circuit, each of the two separate power amplifiers being operable on RF signals in one of the frequency bands; and
the reactive impedance of the electronic circuit and the at least two line lengths are selected so as to provide the same load when the switching device is closed, no matter in which of the at least two frequency bands the transmitter transmits.

16. The method of claim 14, wherein the reactive impedance is formed of a capacitor and an inductor connected in parallel or in series.

17. The method of claim 14, wherein the at least one power amplifier is a single power amplifier operating on all of the at least two frequency bands, the method further comprising:

connecting a second electronic circuit, in parallel to the working load and the first electronic circuit, to the power amplifier at a second line length from the power amplifier; wherein the second electronic circuit comprises a second switching device and a second reactive impedance, the second line length and the second reactive impedance being chosen to form an optimal load with regard to the efficiency of the power amplifier when the transmitter transmits in a second one of the frequency bands at one of the at least two power levels;

if the transmitter transmits at the power level and in the frequency band for which the second line length and the second reactive impedance are chosen to form an optimal load, closing said second switching device;

if the transmitter transmits at at least one of a power level and in a frequency band for which the second line length and the second reactive impedance are not chosen to form an optimal load, opening said second switching device.

* * * * *

UNITED STATES PATENT AND TRADEMARK OFFICE
CERTIFICATE OF CORRECTION

PATENT NO.        : 6,963,241 B2  
APPLICATION NO.   : 10/474445  
DATED             : November 8, 2005  
INVENTOR(S)       : Bo Lindell It is certified that error appears in the above-identified patent and that said Letters Patent is hereby corrected as shown below:

Column 5, line 41, delete " $_L open$ " and replace with -- $Y_L^{open}$ --.

Column 7, line 23, prior to "frequency band" insert --upper--.

Signed and Sealed this

Seventh Day of November, 2006

JON W. DUDAS  
*Director of the United States Patent and Trademark Office*